(12) United States Patent
Kim et al.

(10) Patent No.: US 7,432,185 B2
(45) Date of Patent: Oct. 7, 2008

(54) METHOD OF FORMING SEMICONDUCTOR DEVICE HAVING STACKED TRANSISTORS

(75) Inventors: Hyun-Su Kim, Gyeonggi-do (KR);
Gil-Heyun Choi, Gyeonggi-do (KR);
Jong-Ho Yun, Gyeonggi-do (KR);
Sug-Woo Jung, Gyeonggi-do (KR);
Eun-Ji Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 11/397,448

(22) Filed: Apr. 4, 2006

(65) Prior Publication Data

US 2006/0234487 A1    Oct. 19, 2006

(30) Foreign Application Priority Data

Apr. 18, 2005    (KR)  ............... 10-2005-0032006

(51) Int. Cl.
*H01L 21/44*    (2006.01)
*H01L 21/4763*  (2006.01)

(52) U.S. Cl. .................. 438/597; 438/618; 438/637

(58) Field of Classification Search ................ 438/597, 438/618, 637
See application file for complete search history.

(56) References Cited

U.S. PATENT DOCUMENTS

| 5,475,240 A | 12/1995 | Sakamoto |
| 5,612,552 A | 3/1997 | Owens |
| 5,670,812 A | 9/1997 | Adler et al. |
| 5,872,029 A | 2/1999 | Gardner et al. |
| 6,140,675 A * | 10/2000 | Sugiura et al. .............. 257/301 |
| 6,232,637 B1 | 5/2001 | Gardner et al. |

FOREIGN PATENT DOCUMENTS

| JP | 62-040716 | 2/1997 |
| JP | 2000-208644 | 7/2000 |

* cited by examiner

*Primary Examiner*—Luan Thai
(74) *Attorney, Agent, or Firm*—Myers Bigel Sibley & Sajovec, P.A.

(57) ABSTRACT

There is provided a method of forming a semiconductor device having stacked transistors. When forming a contact hole for connecting the stacked transistors to each other, ohmic layers on the bottom and the sidewall of the common contact hole are separately formed. As a result, the respective ohmic layers are optimally formed to meet requirements or conditions. Accordingly, the contact resistance of the common contact may be minimized so that it is possible to enhance the speed of the semiconductor device.

4 Claims, 14 Drawing Sheets

METHOD OF FORMING SEMICONDUCTOR DEVICE HAVING STACKED TRANSISTORS

FIELD OF THE INVENTION

The present invention relates to a method of forming a semiconductor device, and more particularly, to a method of forming a semiconductor device having stacked transistors.

BACKGROUND OF THE INVENTION

As a semiconductor device is highly integrated, a lot of research for structures in which a plurality of transistors are multi-stacked within a limited area of a semiconductor substrate has been conducted. A static random access memory (SRAM) device, for example, is one of the semiconductor devices employing a stacked structure of transistors.

FIG. 1 is an equivalent circuit diagram of a conventional inverter.

Referring to FIG. 1, a gate electrode of a first transistor TR1, e.g., an n-channel metal oxide semiconductor (NMOS) transistor, and a gate electrode of a second transistor TR2, e.g., a p-channel MOS (PMOS) transistor, are commonly connected to an input signal $V_{in}$ line. A source of the second transistor TR2 is connected to a power voltage $V_{DD}$ line, and drains C of the second transistor TR2 and the first transistor TR1 are connected to an output line $V_{out}$. A source of the first transistor TR1 is connected to a ground voltage $V_{SS}$ line. The device having the above circuit structure may operate as a typical inverter.

The inverter of FIG. 1 may be formed by arranging the first and second transistors TR1 and TR2, of which conductive types are different from each other, on the same plane. However, for high integration of the device, it may be better to configure the inverter as the stacked structure where the second transistor TR2 is stacked on the first transistor TR1.

FIG. 2 is an equivalent circuit diagram of a conventional full CMOS (Complementary Metal-Oxide Semiconductor) SRAM device.

Referring to FIG. 2, the conventional full CMOS SRAM device is configured with two inverters and two transfer transistors TR3 and TR6. The inverters are configured with driving transistors TR1 and TR4, e.g., NMOS transistors, and load transistors TR2 and TR5, e.g., PMOS transistors, wherein the two inverters are cross-coupled to each other. A source of each load transistor TR2 and TR5 is connected to a power voltage $V_{DD}$ line, and a source of each driving transistor TR1 and TR4 is connected to a ground voltage $V_{SS}$ line. Gate electrodes of the transfer transistors TR3 and TR6 are connected to a word line, and one of source/drain thereof is connected to a bit line BL and $\overline{BL}$. The other one of the source/drain of each transfer transistor TR3 and TR6, a drain of each driving transistor TR1 and TR4, and a drain of each load transistor TR2 and TR5 are commonly connected to each of common terminals/contacts C1 and C2. In addition, the common terminal C1 is connected to the gate electrode of the driving transistor TR4 and the gate electrode of the load transistor TR5. Likewise, the common terminal C2 is also connected to the gate electrode of the driving transistor TR1 and the gate electrode of the load transistor TR2.

Although the SRAM device may be formed by arranging the six transistors TR1 to TR6 on the same plane, it may be formed by arranging the driving transistors TR1 and TR4 at a lowermost portion, the load transistors TR2 and TR5 on the driving transistors TR1 and TR4, and the transfer transistors TR3 and TR6 on the load transistors TR2 and TR5, and thus, it is possible to enhance the integration of the device by employing this stacked structure.

In the semiconductor device having the structure of the stacked transistors, the common contact such as the common terminals C1 and C2 may be used to connect the stacked transistors to each other. A method of forming the common contact in the semiconductor device having the stacked transistors will be set forth herebelow.

A plurality of interlayer insulating layers stacked on a semiconductor substrate, and a semiconductor single crystalline layer interposed therebetween, are patterned into a predetermined configuration to thereby form a common contact hole, wherein source/drain regions of a transistor are disposed at a predetermined position of the semiconductor single crystalline layer. Thereafter, a metal layer is conformally formed on the resultant structure and an annealing process is performed so as to form an ohmic layer, e.g., a metal silicide layer, on the semiconductor substrate exposed by the contact hole, and sidewalls of the semiconductor single crystalline layer exposed by the contact hole. Afterwards, a conductive layer is formed over the resultant structure to fill the common contact hole, to thereby form a common contact plug.

The contact resistance of the common contact may be varied with the state of the ohmic layer disposed on the bottom and the sidewall of the common contact. For example, an area of the exposed semiconductor substrate under the bottom of the common contact is different from an area of the exposed semiconductor single crystalline layer at the sidewall of the common contact. There is also difference between the thicknesses of the respective ohmic layers on the bottom and the sidewall of the common contact, in order to optimally drive the device. In detail, if the metal layer with a predetermined thickness is formed on the bottom of the common contact to enable the ohmic layer on the bottom to have an optimized thickness, the metal layer on the sidewall of the common contact may be formed thinly in comparison with the metal layer on the bottom. Otherwise, as illustrated in FIG. 3, a void may form between the semiconductor single crystalline layer and the ohmic layer on the sidewall of the common contact so that the resistance may be increased. On the contrary, if the metal layer with a certain thickness is formed on the sidewall of the common contact to enable the ohmic layer on the sidewall to have an optimized thickness, the ohmic layer on the bottom of the common contact may be formed thickly in comparison with the ohmic layer on the sidewall. Resultingly, as illustrated in FIG. 4, a spike is formed so that a leakage current may occur.

SUMMARY OF THE INVENTION

Embodiments of the present invention provide methods of forming a semiconductor device having stacked transistors capable of optimizing ohmic layers which are formed on both a bottom and a sidewall of a common contact.

In the method of forming the semiconductor device having the stacked transistors according to embodiments of the present invention, ohmic layers on the bottom and the sidewall of the common contact hole are separately formed.

Embodiments of the present invention provide methods of forming a semiconductor device, the method including: forming a plurality of interlayer insulating layers and a semiconductor single crystalline layer interposed therebetween, over a semiconductor substrate; forming a common contact hole to expose the semiconductor substrate by patterning the plurality of the interlayer insulating layers and the semiconductor single crystalline layer interposed therebetween; forming a first ohmic layer to cover a sidewall of the semiconductor single crystalline layer which is exposed by the common contact hole; forming a second ohmic layer to cover the semiconductor substrate which is exposed by the common contact hole; and forming a common contact plug to fill the common contact hole.

In some embodiments, the methods further include, before the forming of the first ohmic layer, forming a blocking layer to expose the sidewall of the semiconductor single crystalline layer and cover the bottom of the common contact hole, wherein the blocking layer is removed after forming the first ohmic layer. The blocking layer may be formed of a material which may be selectively removed in a following process without any reaction with the underlying semiconductor substrate using the characteristic that a step coverage is poor at sidewalls. For example, the blocking layer is formed using physical vapor deposition (PVD) or sputtering. The blocking layer is formed of titanium nitride layer.

In other embodiments of the present invention, a method of forming a semiconductor device includes: forming a lower transistor and a lower interlayer insulating layer covering the lower transistor, over the semiconductor substrate; forming an upper transistor and an upper interlayer insulating layer covering the upper transistor, on the lower interlayer insulating layer; forming a common contact hole to expose source/drain regions of the lower transistor by patterning the upper interlayer insulating layer, source/drain regions of the upper transistor, and the lower interlayer insulating layer; forming a blocking layer to cover the bottom of the common contact hole but to expose the source/drain regions of the upper transistor; forming a first ohmic layer on the source/drain regions of the upper transistor exposed by the blocking layer; exposing the source/drain regions of the lower transistor by removing the blocking layer disposed on the bottom of the common contact hole; forming a second ohmic layer on the exposed source/drain regions of the lower transistor; and forming a common contact plug to fill the common contact hole with a conductive layer.

In further embodiments, before the forming of the common contact plug, a barrier metal layer is conformally formed. Each of the first and second ohmic layers is formed of a metal silicide, the metal being at least one selected from the group consisting of titanium, cobalt, nickel, and tungsten.

In yet further embodiments, a method further includes, before the forming the upper transistor and the upper interlayer insulating layer, forming an intermediate transistor and an intermediate interlayer insulating layer covering the intermediate transistor, on the lower interlayer insulating layer. In this case, the intermediate interlayer insulating layer and source/drain regions of the intermediate transistor are patterned when forming the common contact hole.

In some embodiments, the common contact hole exposes at least one gate electrode of the lower transistor and the intermediate transistor, and the first ohmic layer is formed on the sidewall of the exposed gate electrode.

In other embodiments of the present invention, a method of forming a semiconductor device, includes: forming a first transistor including a first gate pattern and a first source/drain region on both sides of the first gate pattern, over a semiconductor substrate, wherein the first source/drain region is disposed in the semiconductor substrate; forming a first interlayer insulating layer to cover the first transistor; forming a first epitaxial contact plug in contact with the first source/drain region through the first interlayer insulating layer; forming a first semiconductor single crystalline layer on the first interlayer insulating layer, wherein the first semiconductor single crystalline layer is in contact with the first epitaxial contact plug; forming a second transistor including a second gate pattern and a second source/drain region on both sides of the second gate pattern, over the first semiconductor single crystalline layer, wherein the second source/drain region is disposed in the first semiconductor single crystalline layer; forming a second interlayer insulating layer to cover the second transistor; forming a common contact hole to expose the semiconductor substrate by patterning the second interlayer insulating layer, the first semiconductor single crystalline layer, and the first epitaxial contact plug; forming a blocking layer to cover the bottom of the common contact hole but to expose the sidewall of the first semiconductor single crystalline layer; forming a first ohmic layer to cover the sidewall of the first semiconductor single crystalline layer; removing the blocking layer; forming a second ohmic layer on the semiconductor substrate on the bottom of the common contact hole; and forming a common contact plug to fill the common contact hole.

In further embodiments, a method further includes, before the forming of the common contact hole: forming a second epitaxial contact plug in contact with the first semiconductor single crystalline layer through the second interlayer insulating layer; forming a second semiconductor single crystalline layer on the second interlayer insulating layer, wherein the second semiconductor single crystalline layer is in contact with the second epitaxial contact plug; forming a third transistor including a third gate pattern and a third source/drain region on both sides of the third gate pattern, over the second semiconductor single crystalline layer, wherein the third source/drain region is disposed in the second semiconductor single crystalline layer; and forming a third interlayer insulating layer to cover the third transistor. Herein, the third interlayer insulating layer and the second semiconductor single crystalline layer are also patterned when forming the common contact hole, and the first ohmic layer is also formed on the sidewall of the second semiconductor single crystalline layer.

In yet further embodiments, the first and second semiconductor single crystalline layers are formed by forming an amorphous semiconductor layer on the semiconductor substrate where the second epitaxial contact plug is formed; and transforming an amorphous structure of the amorphous semiconductor layer into a single crystalline structure by performing annealing process. In addition, the first and second semiconductor single crystalline layers are formed by epitaxially growing an epitaxial layer from the first and second epitaxial contact plugs, respectively, through an epitaxial growth.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION

Figure 1:
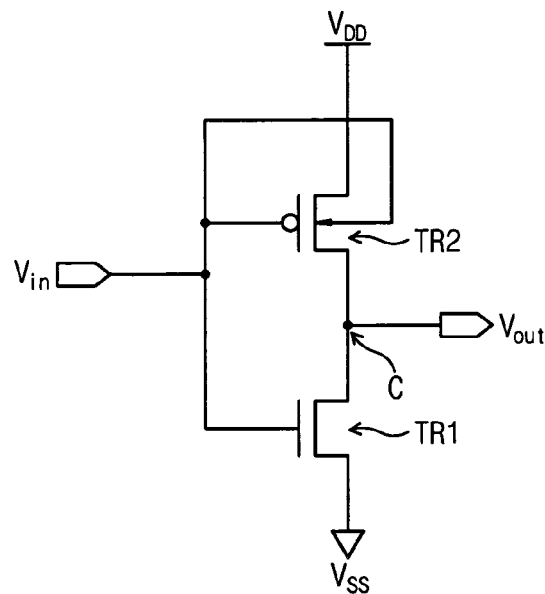
FIG. 1 is an equivalent circuit diagram of a conventional inverter.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

FIGS. 5 to 12 are cross-sectional views illustrating a method of forming an inverter according to embodiments of the present invention.

Figure 5:
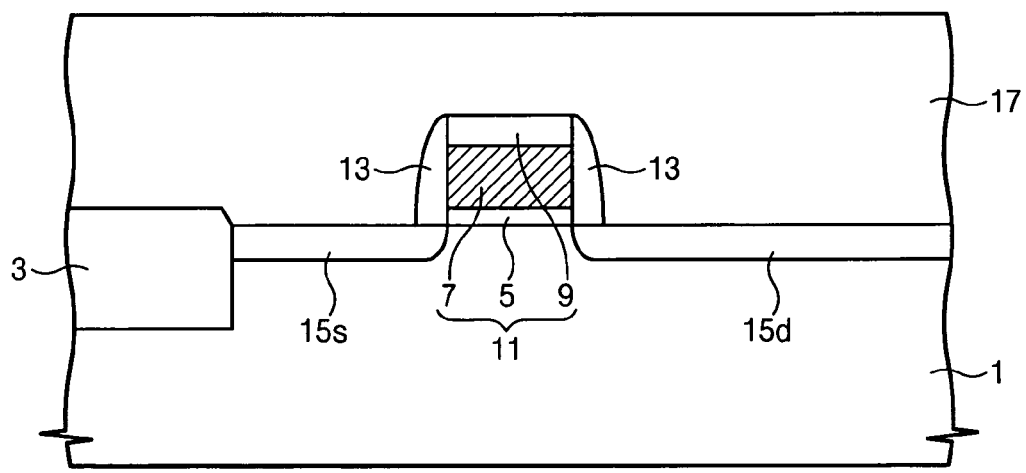
FIGS. 5 to 12 are cross-sectional views illustrating a method of forming an inverter according to embodiments of the present invention.

Referring to FIG. 5, a first isolation layer 3 is formed in a semiconductor substrate 1 using, for example, a typical shallow trench isolation (STI) process or the like so as to define an active region. A thermal oxidation process is performed over the semiconductor substrate 1 to form a first gate oxide layer 5 on the active region. Upon the entire surface of the semiconductor substrate 1, a first gate electrode layer 7 and a first capping layer 9 are stacked, and they are patterned to thereby form a first gate pattern 11. The first gate electrode layer 7 may be formed, for example, of at least one of polysilicon doped with impurities, tungsten, tungsten silicide, and tungsten nitride. An ion implantation process is performed using the first gate pattern 11 as an ion implantation mask to form first impurity implantation regions $15s$ and $15d$. The first impurity implantation regions may comprise a first source region $15s$ and a first drain region $15d$. A first spacer 13 is formed covering sidewalls of the first gate pattern 11, to thereby complete a first transistor. Although not shown in the drawings, a heavily doped region may be formed using the first spacer 13 and the first gate pattern 11. A first interlayer insulating layer 17 is formed to cover the first transistor.

Figure 6:
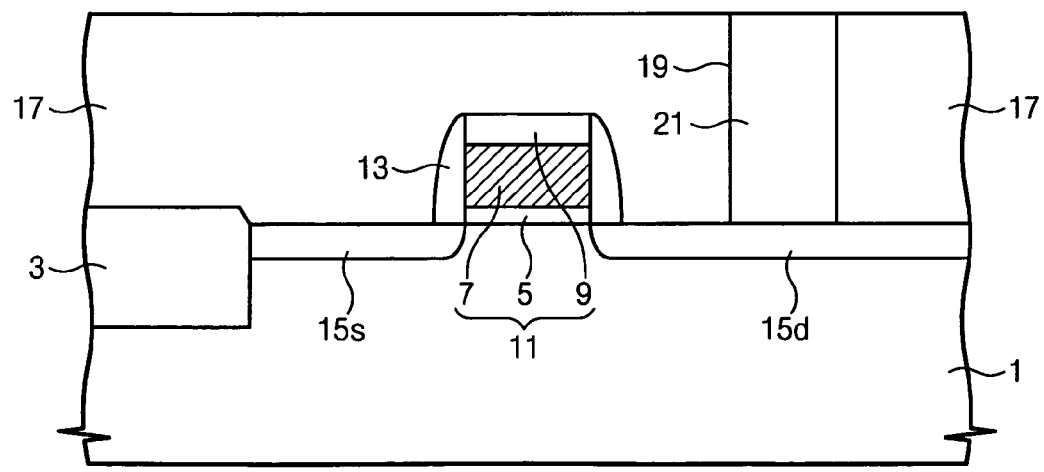

Referring to FIG. 6, the first interlayer insulating layer 17 is patterned to form a contact hole 19 which exposes the first drain region $15d$. An epitaxial contact plug 21 is formed in the contact hole 19 by growing an epitaxial layer from a semiconductor single crystalline structure of the exposed first drain region $15d$ through epitaxial growth. A chemical mechanical polishing (CMP) process may be performed for planarizing the top surface of the epitaxial contact plug 21.

Figure 7:
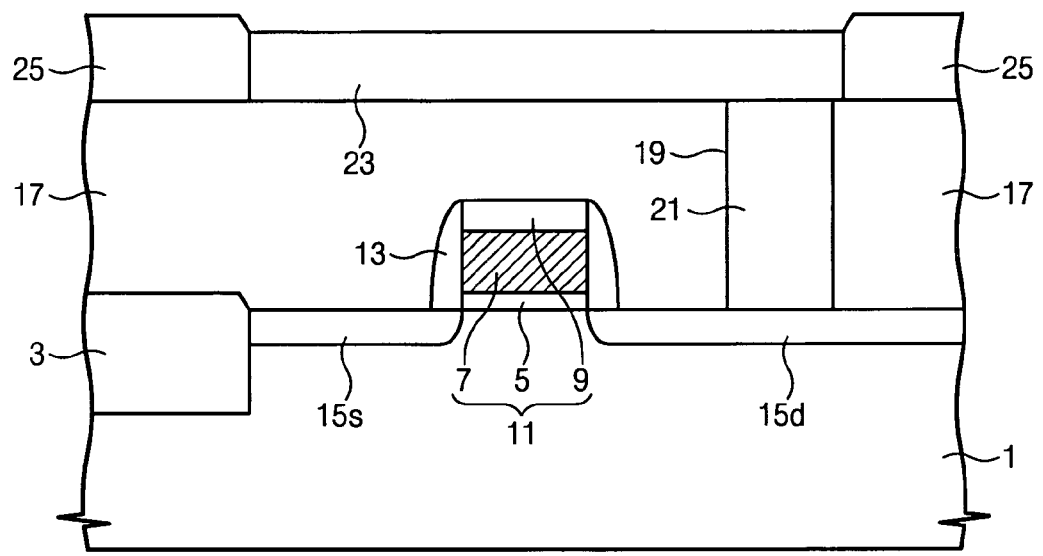

Referring to FIG. 7, a semiconductor single crystalline layer 23 is formed on the entire surface of the semiconductor substrate 1. The semiconductor single crystalline layer 23, for instance, may be formed using solid phase epitaxial growth (SPEG) process which transforms an amorphous structure of an amorphous polysilicon layer (not shown) into a single crystalline silicon structure by annealing the amorphous polysilicon layer formed over the entire surface of the semiconductor substrate 1. Herein, the top surface of the epitaxial contact plug 21 may act as a single crystalline seed layer. Alternatively, the semiconductor single crystalline layer 23 may be formed by epitaxially growing an epitaxial layer from the epitaxial contact plug 21 using selective epitaxial growth (SEG) process. In this case, a CMP process may be additionally performed for planarizing a top surface thereof. A second isolation layer 25 is formed on the semiconductor single crystalline layer 23 using, for example, a general STI process. Although it is illustrated in FIG. 7 as if the second isolation layer 25 seems to be in contact with the first interlayer insulating layer 17, the second isolation layer 25 need not be in contact with the first interlayer insulating layer 17.

Figure 8:
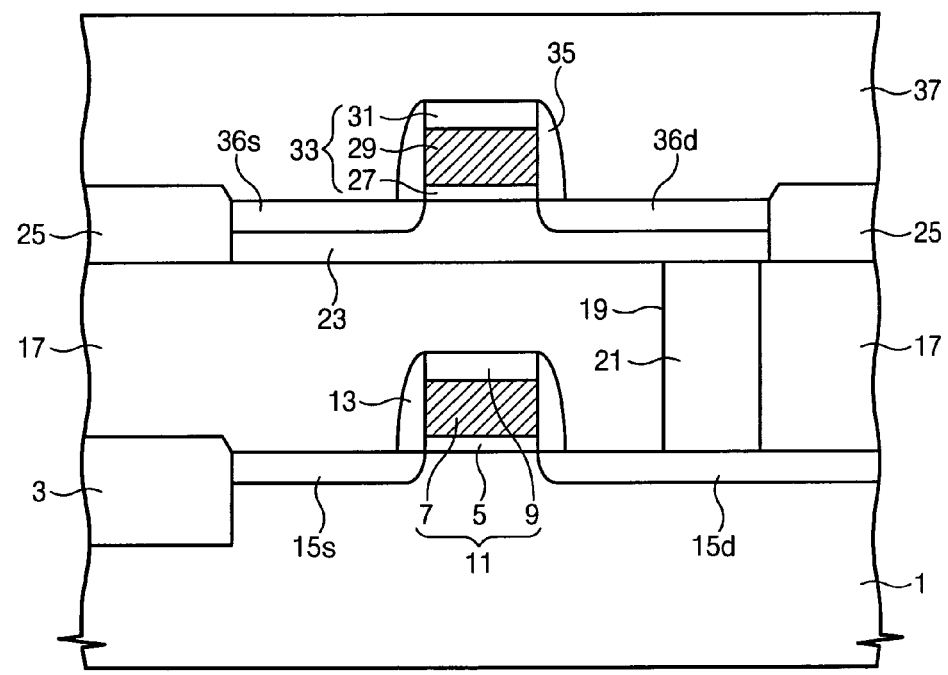

Referring to FIG. 8, upon the semiconductor single crystalline layer 23, a second gate pattern 33 and a second spacer 35 covering sidewalls of the second gate pattern 33 are formed. The second gate pattern 33 is provided with a second gate oxide layer 27, a second gate electrode 29 and a second capping layer 31. An ion implantation process is performed to form a second source region 36s and a second drain region 36d, to thereby complete a second transistor. Thereafter, a second interlayer insulating layer 37 is formed to cover the second transistor.

Figure 9:
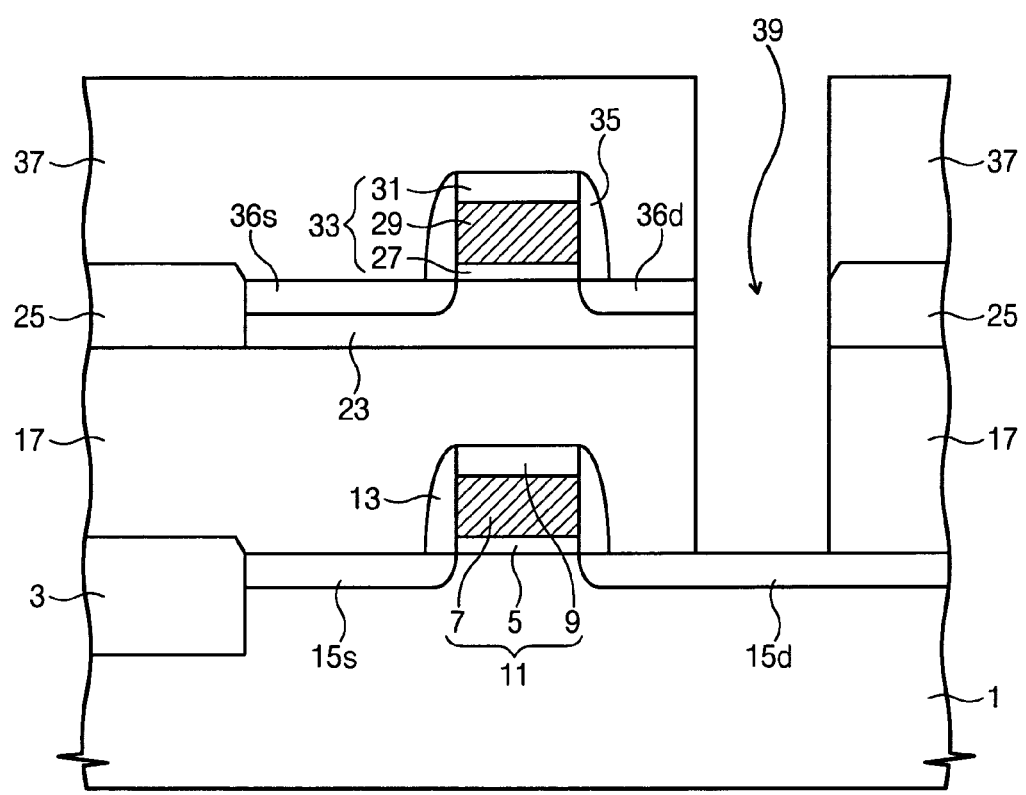

Referring to FIG. 9, the second interlayer insulating layer 37, the semiconductor single crystalline layer 23 and the epitaxial contact plug 21 are patterned in sequence to form a common contact hole 39 which exposes the first drain region 15d. The common contact hole 39 may be overlapped with the contact hole 19, but it may be formed such that it is not overlapped with the contact hole 19. In case that the common contact hole 39 is not overlapped with the contact hole 19, the common contact hole 39 is formed by patterning the second interlayer insulating layer 37, the semiconductor single crystalline layer 23 and the first interlayer insulating layer 17 in sequence.

Figure 10:
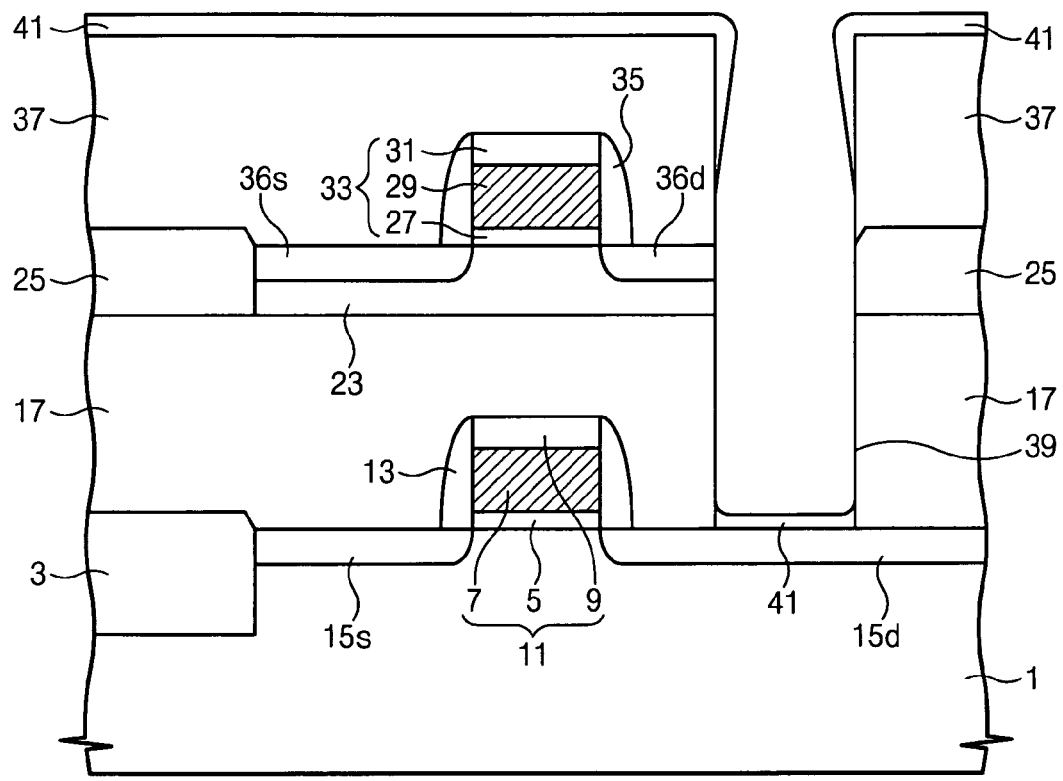

Referring to FIG. 10, a blocking layer 41 is formed on the entire surface of the semiconductor substrate 1 where the common contact hole 39 is formed. Herein, the blocking layer 41 is formed such that it covers the first drain region 15d of the semiconductor substrate 1, the top surface of the second interlayer insulating layer 37, and a predetermined portion of the second interlayer insulating layer 37 disposed at an inlet of the common contact hole 39, but it does not cover the semiconductor single crystalline layer 23 on the sidewalls of the contact hole 39. The blocking layer 41, which may, for example, comprise a titanium nitride layer or the like, may be formed using a method of selectively covering the common contact hole 39, e.g., sputtering or a physical vapor deposition (PVD).

Figure 11:
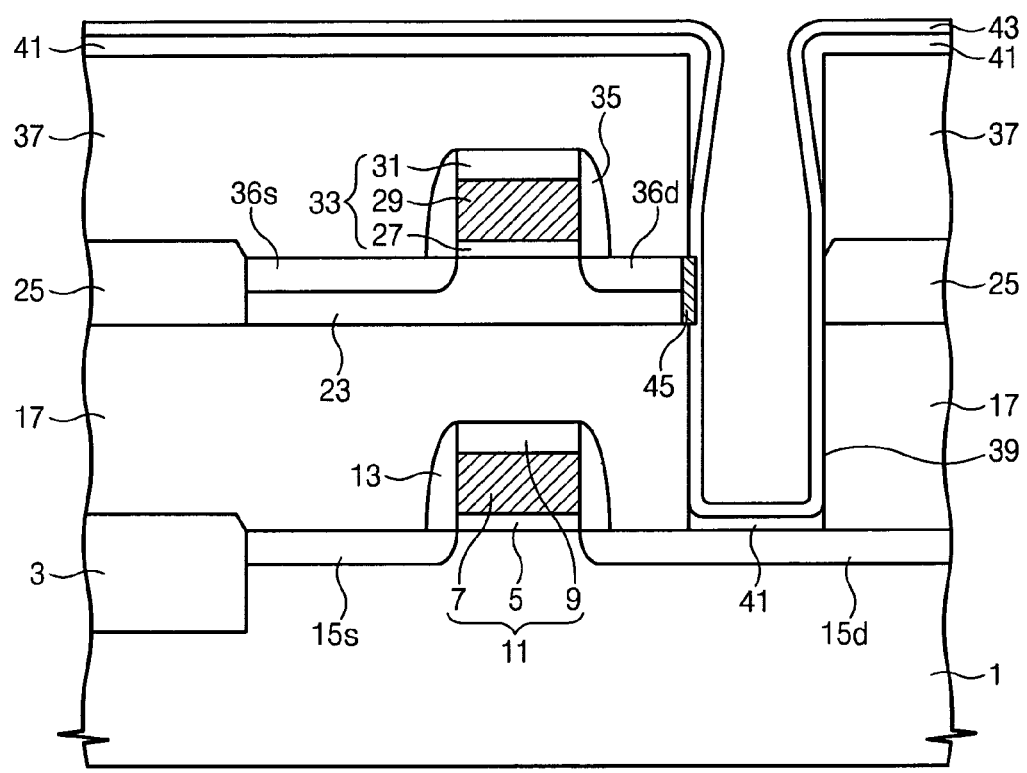

Referring to FIG. 11, a first metal layer 43 is conformally formed on the entire surface of the semiconductor device 1. The first metal layer 43 may be formed using, for example, atomic layer deposition (ALD) or chemical vapor deposition (CVD). The first metal layer, for example, may be formed of at least one of titanium, cobalt, nickel, and/or tungsten. After forming the first metal layer 43, an annealing process is performed to form a first ohmic layer 45 between the first metal layer 43 and the semiconductor single crystalline layer 23. Alternatively, the fist ohmic layer 45 may be formed at the same time with the formation of the first metal layer 43 using the ALD or the CVD process. The first ohmic layer 45, for example, may be formed of a metal silicide, wherein the metal may be at least one of titanium, cobalt, nickel, and/or tungsten. At this time, on the bottom of the common contact hole 39, there is not formed the first ohmic layer 45 because of the blocking layer 41.

Figure 12:
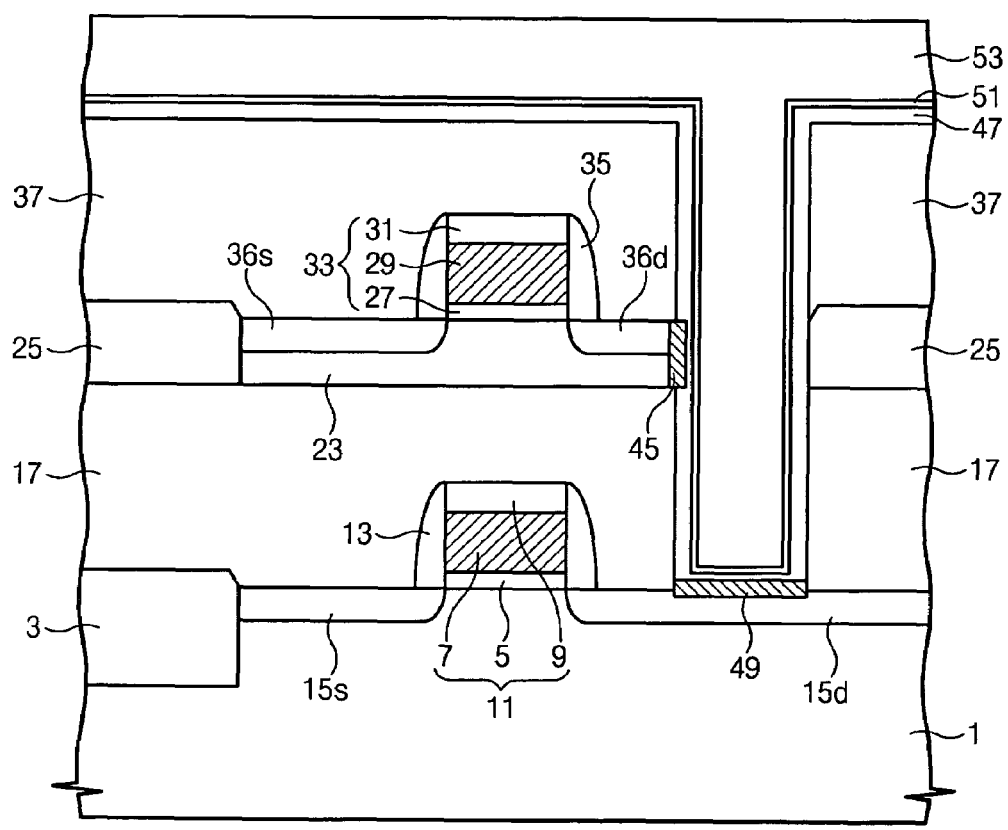

Referring to FIG. 12, the first metal layer 43, which is not converted into the first ohmic layer 45, is removed. Thereafter, the blocking layer 41 is removed. A second metal layer 47 is conformally formed on the entire surface of the semiconductor substrate 1. The second metal layer 47 may be formed, for example, using an ALD or CVD process. The second metal layer 47, for example, may be formed of at least one of titanium, cobalt, nickel and/or tungsten. Afterwards, an annealing process is performed again so as to form a second ohmic layer 49 on the semiconductor substrate 1 exposed by the common contact hole 39. The second ohmic layer 49 may be formed of a metal silicide, wherein the metal may be at least one of titanium, cobalt, nickel, and/or tungsten. The second ohmic layer 49 may be simultaneously formed with the deposition of the second metal layer 47. A barrier metal layer or a diffusion barrier layer 51 is conformally formed on the entire surface of the semiconductor substrate 1. Thereafter, a conductive layer 53 is formed to fill the common contact hole 39. The barrier metal layer 51, for example, may be formed of at least one of titanium nitride layer, tantalum nitride layer, tungsten nitride layer, titanium aluminum nitride layer and/or tantalum aluminum nitride layer. The conductive layer 53, for example, may be formed of tungsten. A planarization process may be performed on the conductive layer 53 to form the common contact plug in the contact hole 39.

In the inverter structure of FIG. 12, the first gate pattern 11, the first source region 15s and the first drain region 15d, for example, may constitute the first transistor TR1 which has been illustrated in the equivalent circuit diagram of the conventional inverter with reference to FIG. 1. Likewise, the second gate pattern 33, the second source region 36s and the second drain region 36d may comprise the second transistor TR2 of FIG. 1. The common contact plug may correspond to the drain node C of FIG. 1.

According to embodiments of the present invention, since the ohmic layers are separately formed on each of the bottom and the sidewall of the common contact plug, it may facilitate optimally forming the ohmic layers to meet requirements or conditions.

Hereinafter, a method of forming an SRAM device having transistors stacked in three layers according to another embodiment of the present invention will be illustrated with reference to FIGS. 13 to 17.

Figure 13:
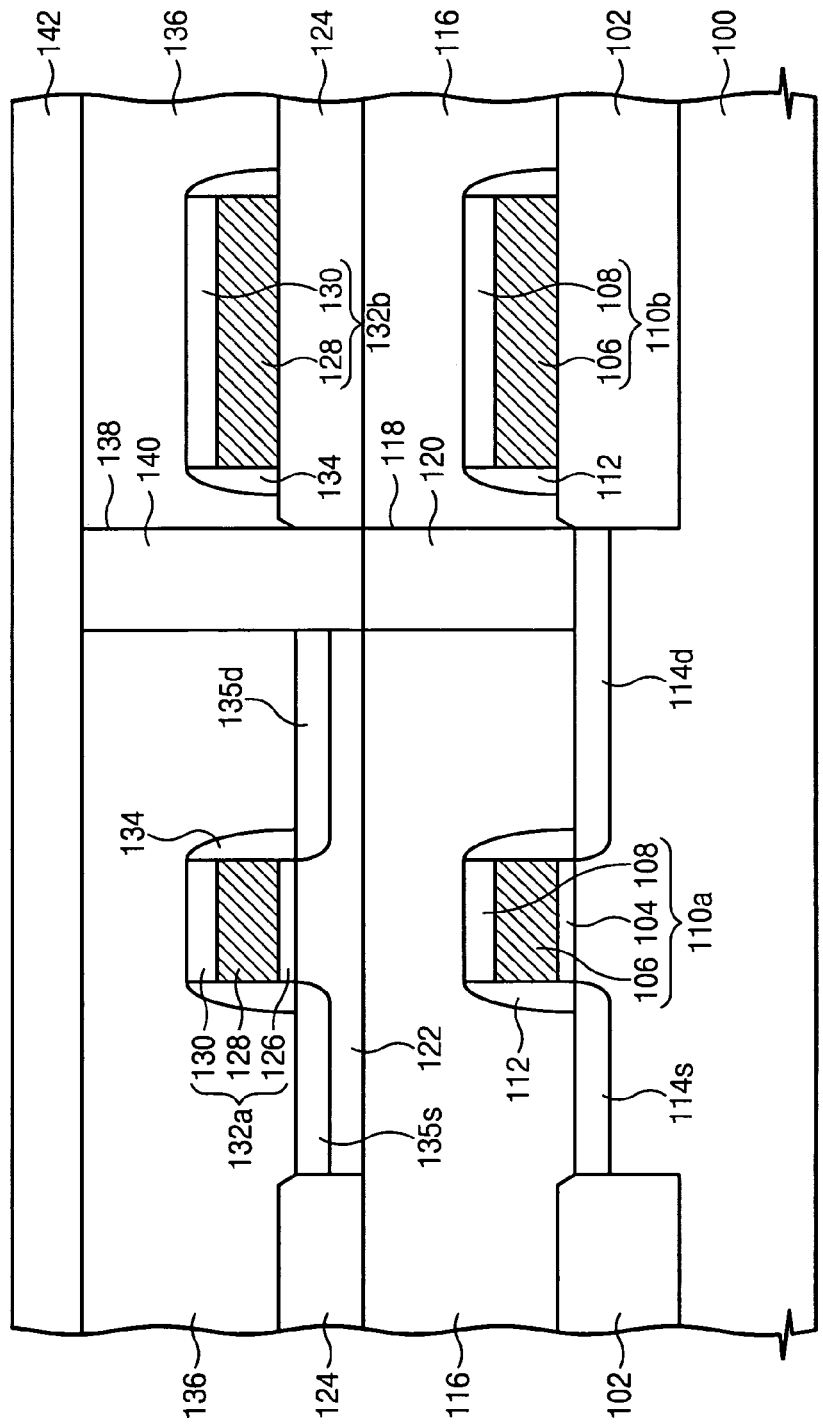
FIGS. 13 to 17 are cross-sectional views illustrating a method of forming an SRAM device according to further embodiments of the present invention.

Referring to FIG. 13, a first isolation layer 102 is formed on a semiconductor substrate 100 using, for example, an STI process, or the like, so as to define an active region. A thermal oxidation process is performed over the semiconductor substrate 100 to form a first gate oxide layer 104 on the active region. A first gate electrode layer 106 and a first capping layer 108 are stacked on the entire surface of the semiconductor substrate 100 and patterned to thereby form a first drive gate pattern 110a and a second drive gate pattern 110b. A first spacer 112 is formed to cover sidewalls of each drive gate pattern 110a and 110b. An ion implantation process is performed to form a first source region 114s and a first drain region 114d. Although it is illustrated that the second drive gate pattern 10b in FIGS. 13 to 17 is disposed on the isolation layer 102, it is just shown a local cross-sectional view for the sake of illustrative convenience. Although not shown in the drawings, the second drive gate pattern 110b may have a gate oxide layer and source/drain regions, wherein the source/drain regions may be disposed on both sides of the second drive gate pattern 110b. A first interlayer insulating layer 116 is formed to cover the drive gate patterns 110a and 110b. The first interlayer insulating layer 116 is patterned to form a first contact hole 118 which exposes the first drain region 114d.

Afterwards, a first epitaxial contact plug 120 is formed to fill the first contact hole 118 through, for example, an SEG process.

Referring to FIG. 13, a first semiconductor single crystalline layer 122 is formed on the entire surface of the semiconductor substrate 100. A second isolation layer 124 is formed on the first semiconductor single crystalline layer 122 using, for example, a typical STI process, or the like. A first load gate pattern 132a, a second load gate pattern 132b and a second spacer 134 covering sidewalls of each load gate pattern 132a and 132b are formed, wherein each of the first and second load gate patterns 132a and 132b is provided with a second gate oxide layer 126 (not shown in FIG. 13 for second load gate pattern 132b), a second gate electrode 128 and a second capping layer 130. Afterwards, an ion implantation process is performed so as to form a second source region 135s and a second drain region 135d. Thereafter, a second interlayer insulating layer 136 is formed and it is patterned to form a second contact hole 138 which exposes the first epitaxial contact plug 120, wherein the second contact hole 138 is overlapped with the first contact hole 118. A second epitaxial contact plug 140 is formed to fill the second contact hole 138 through the SEG process. A second semiconductor single crystalline layer 142 is formed on the second interlayer insulating layer 136 and the second epitaxial contact plug 140.

Figure 14:
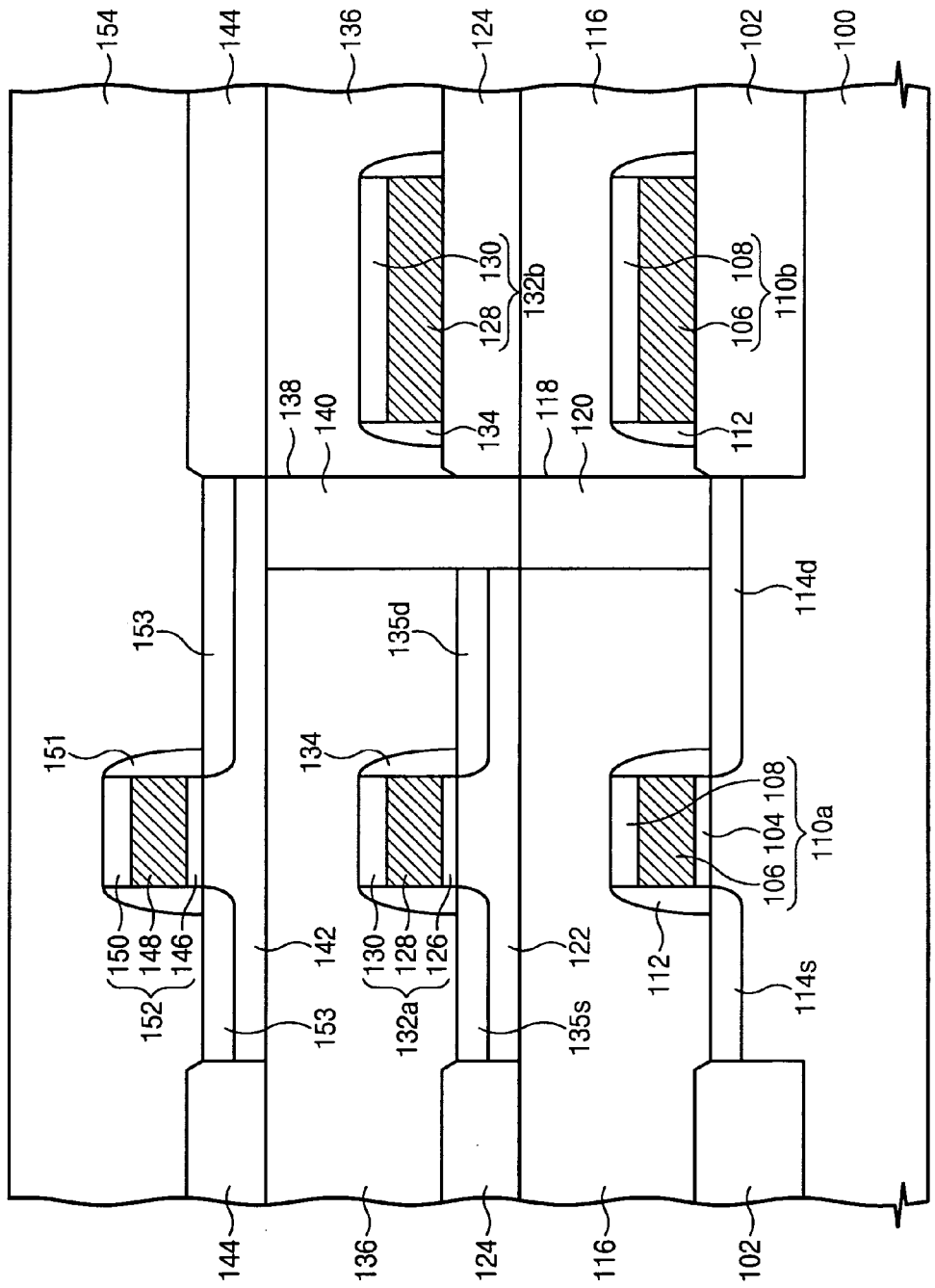

Referring to FIG. 14, a third isolation layer 144 is formed on the second semiconductor single crystalline layer 142 using, for example, the general STI process, or the like. A transfer gate pattern 152 and a third spacer 151 are formed, wherein the transfer gate pattern 152 is configured with a third gate oxide layer 146, a third gate electrode 148 and a third capping layer 150. An ion implantation process is performed to form third source/drain regions 153. Thereafter, a third interlayer insulating layer 154 is formed. Although not shown in the drawings, another transfer gate pattern may be provided on the second semiconductor single crystalline layer 142 such that another transfer gate pattern is disposed over the second load gate pattern 132b.

Figure 15:
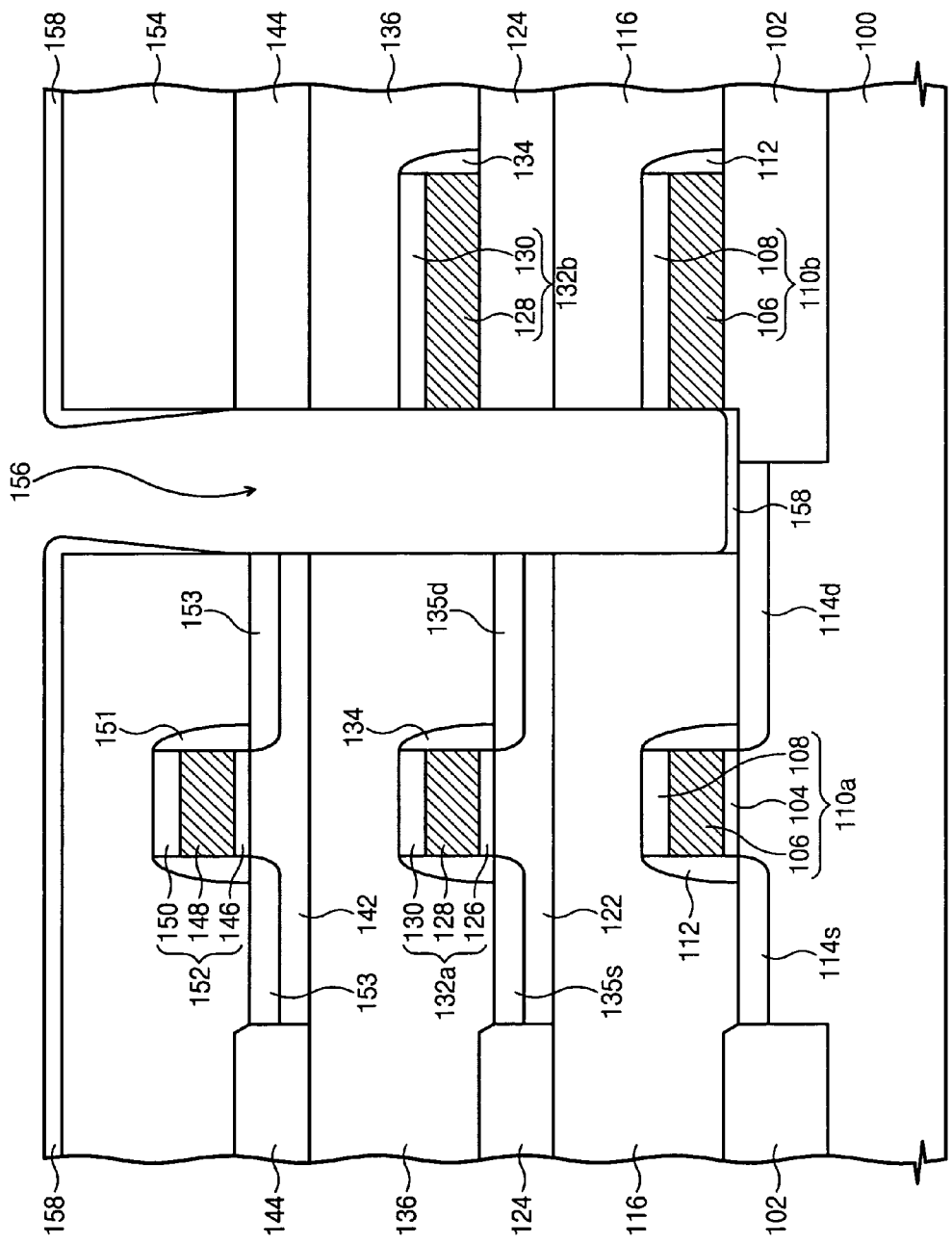

Referring to FIG. 15, the third interlayer insulating layer 154, the second semiconductor single crystalline layer 142, the second interlayer insulating layer 136, the first semiconductor single crystalline layer 122 and the first interlayer insulating layer 116 are patterned in sequence to thereby form a common contact hole 156 having a width greater than that of the second contact hole 138, wherein the second contact hole 138 is overlapped with the common contact hole 156. When forming the common contact hole 156, portions of the isolation layers 102, 124 and 144, a portion of the first capping layer 108 and the first spacer 112 on one sidewall of the second drive gate pattern 110b, and a portion of the second capping layer 130 and the second spacer 134 on one sidewall of the second drive gate pattern 110b, may be removed so that the first and second gate electrodes 106 and 128 are exposed. Afterwards, a blocking layer 158 may be formed on the entire surface of the semiconductor substrate 1 where the common contact hole 156 is formed. Herein, the blocking layer 158 is formed such that it covers the first drain region 114d of the semiconductor substrate 100, the top surface of the third interlayer insulating layer 154, and a predetermined portion of the third interlayer insulating layer 154 disposed at an inlet of the common contact hole 156, but it does not cover the semiconductor single crystalline layers 142 and 122 on sidewalls of the contact hole 156. The blocking layer 158 (such as a titanium nitride layer or the like) may be formed using a method of selectively covering the common contact hole 156, e.g., sputtering or a PVD process.

Figure 16:
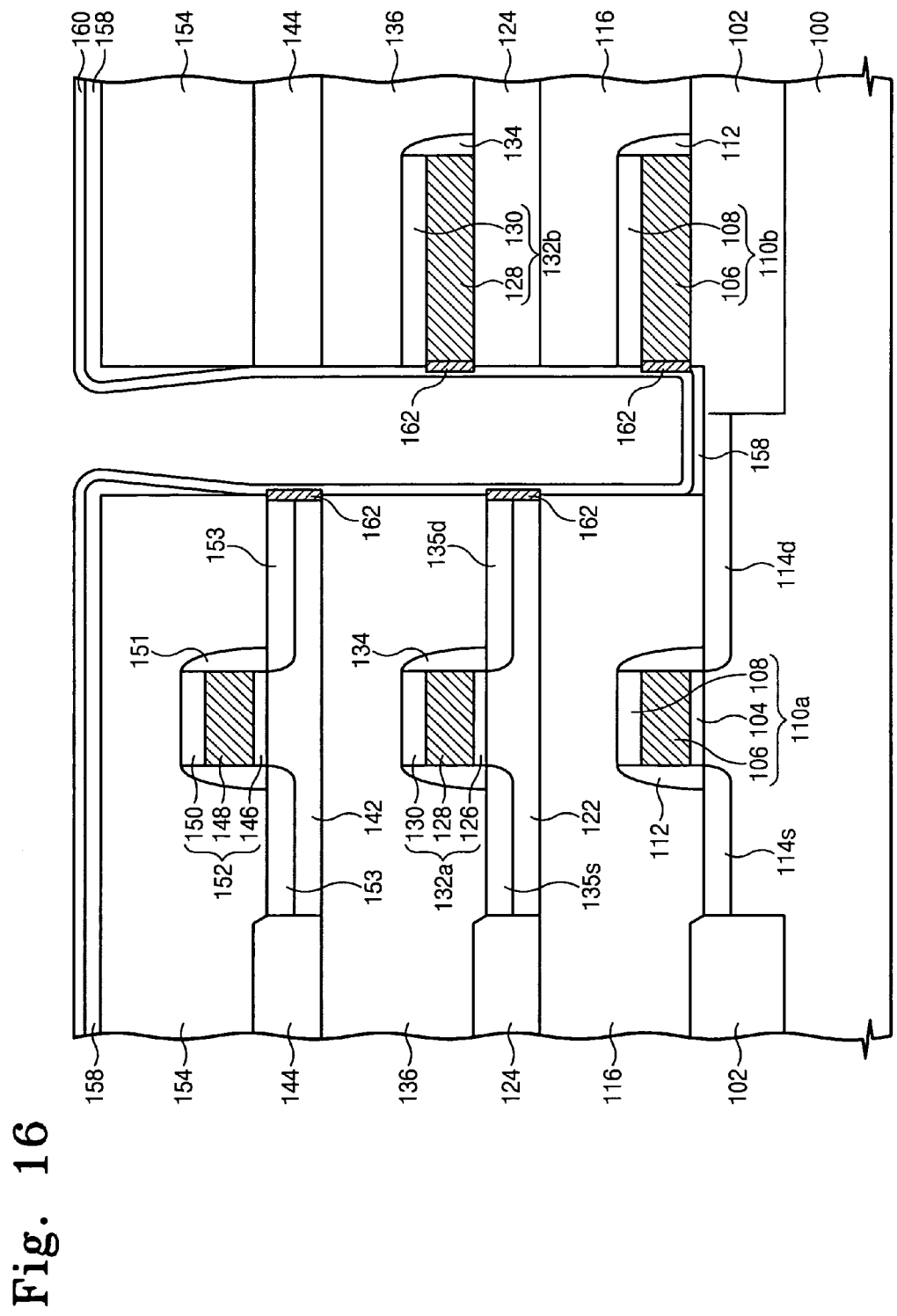

Referring to FIG. 16, a first metal layer 160 is conformally formed on the entire surface of the semiconductor substrate 100. The first metal layer 160 may be formed using, for example, an ALD or CVD process. The first metal layer 160, for example, may be formed of at least one of titanium, cobalt, nickel, and tungsten. After forming the first metal layer 160, an annealing process is performed to form a first ohmic layer 162 between the first metal layer 160 and the semiconductor single crystals 122 and 142, and between the first metal layer 160 and the gate electrodes 106 and 128, respectively. Alternatively, the first ohmic layer 162 may be formed at the same time with the deposition of the first metal layer 160 using the ALD or the CVD process. The first ohmic layer 162, for example, may be formed of a metal silicide, wherein the metal may be at least one of titanium, cobalt, nickel, and/or tungsten. At this time, on the bottom of the common contact hole 156, there is not formed the first ohmic layer 162 because of the blocking layer 158.

Figure 17:
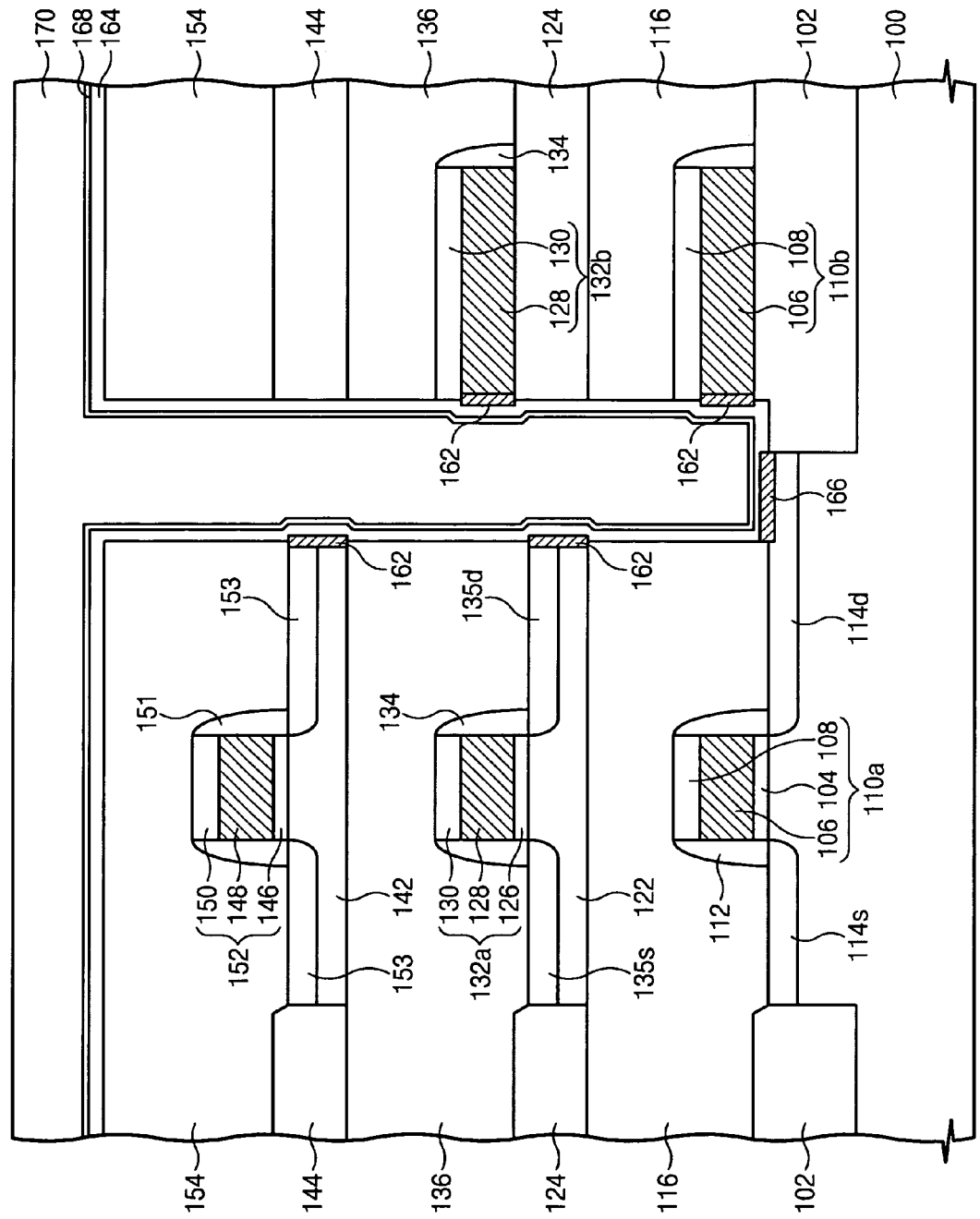

Referring to FIG. 17, the first metal layer 160, which is not converted into the first ohmic layer 162, is removed. Thereafter, the blocking layer 158 is removed. Herein, the first metal layer 160 and the first ohmic layer 162 may be selectively removed using wet etching process. A second metal layer 164 is conformally formed on the entire surface of the semiconductor substrate 100. Afterwards, an annealing process is performed again so as to form a second ohmic layer 166 on the semiconductor substrate 100 exposed by the common contact hole 156. The second ohmic layer 166 may be formed, for example, of a metal silicide, wherein the metal may be at least one of titanium, cobalt, nickel, and/or tungsten. The second ohmic layer 166 may be simultaneously formed with the deposition of the second metal layer 164. A barrier metal layer or a diffusion barrier layer 168 is conformally formed on the entire surface of the semiconductor substrate 100. Thereafter, a conductive layer 170 is formed to fill the common contact hole 156. The barrier metal layer 168, for example, may be formed of at least one of titanium nitride layer, tantalum nitride layer, tungsten nitride layer, titanium aluminum nitride layer and/or tantalum aluminum nitride layer. A planarization process is performed over the conductive layer 170 to form a common contact plug fill the common contact hole 156.

Figure 2:
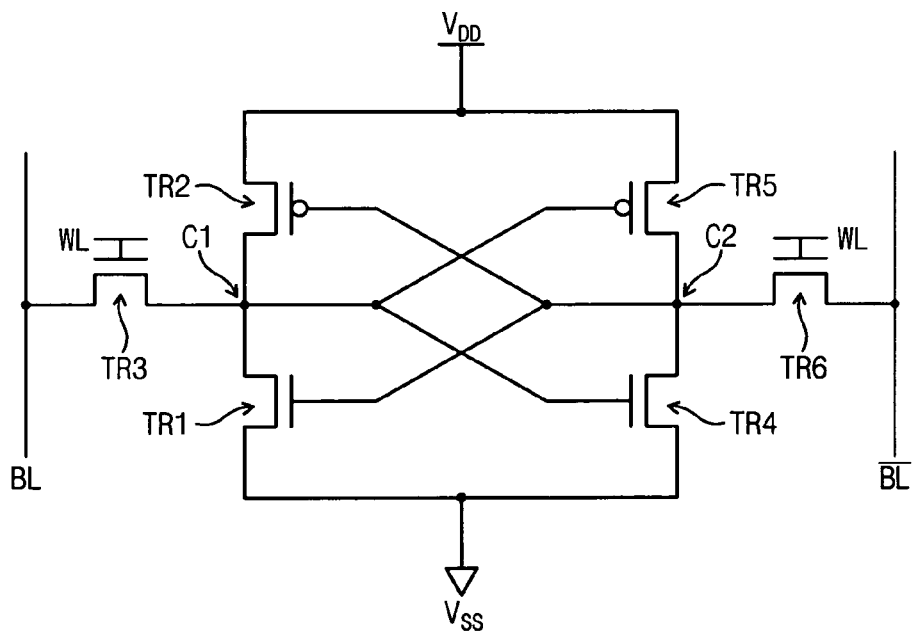
FIG. 2 is an equivalent circuit diagram of a conventional full complementary metal oxide semiconductor (CMOS) static random access memory (SRAM) device.
Figure 3:
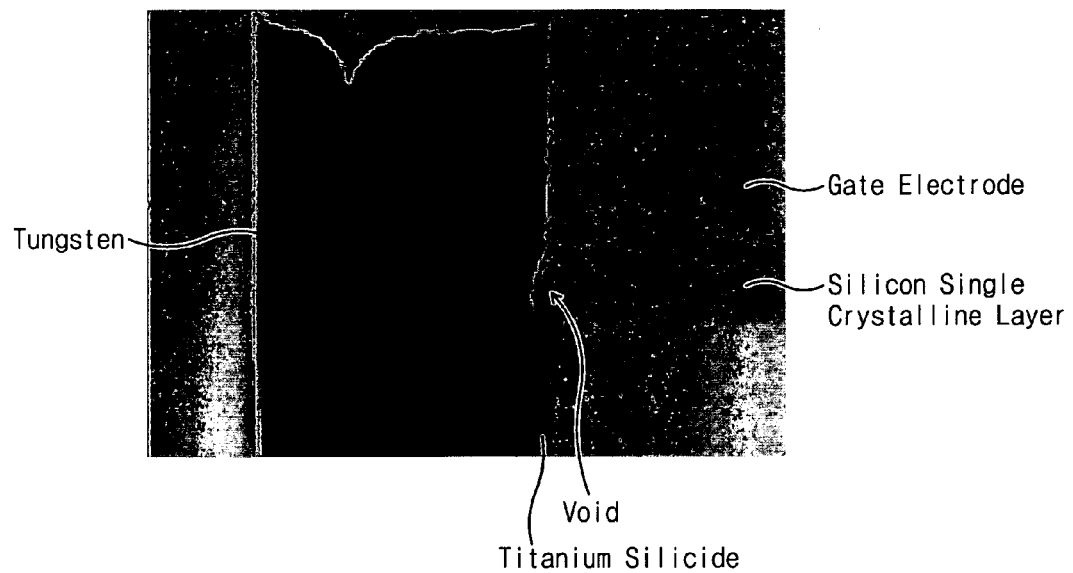
FIGS. 3 and 4 are scanning electron microscope (SEM) photographs showing a portion of a semiconductor device according to the conventional method of forming the semiconductor device having stacked transistors.
Figure 4:
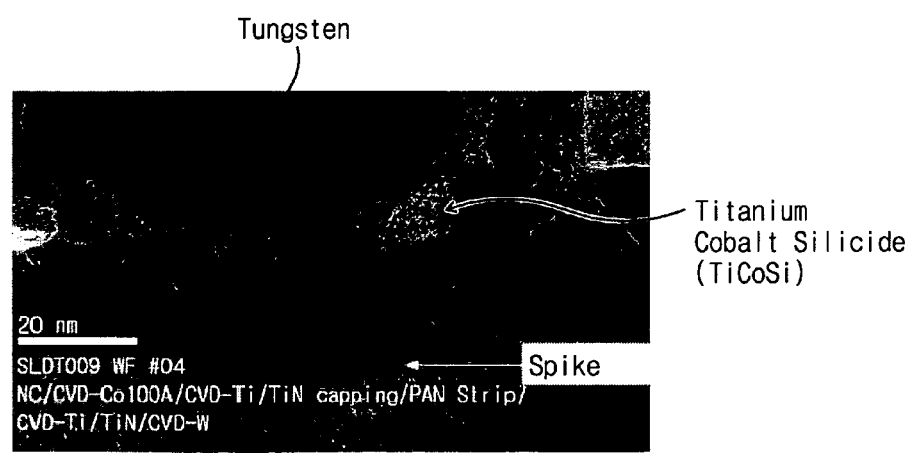

In the SRAM device of FIG. 17, the first drive gate pattern 110a may correspond to one of the gate patterns of the drive transistors TR1 and TR4 in FIG. 2, and the second drive gate pattern 110b may correspond to the other one of the drive transistors TR1 and TR4 in FIG. 2. The first load gate pattern 132a may correspond to one of the gate patterns of the load transistors TR2 and TR5 in FIG. 2, and the second load gate pattern 132b may correspond to the other one of the gate patterns of the load transistors TR2 and TR5 in FIG. 2. The transfer gate pattern 152 may correspond to one of the transfer transistors TR3 and TR6. The common contact plug may be one of the common terminals C1 and C2 in FIG. 2.

As stated above, in accordance with the method of forming the semiconductor device having stacked transistors according to embodiments of the present invention, since the ohmic layer on the bottom of the common contact hole is separately formed from the ohmic layer on the sidewall of the common contact hole, it may be possible to optimally form the respective ohmic layers to meet requirements or conditions. Accordingly, the contact resistance of the common contact may be minimized so that it is possible to enhance the speed of the semiconductor device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a semiconductor device, the method comprising:

forming a plurality of interlayer insulating layers and a semiconductor single crystalline layer interposed therebetween, on a semiconductor substrate;

forming a common contact hole to expose the semiconductor substrate by patterning the plurality of interlayer insulating layers and the semiconductor single crystalline layer;

forming a first ohmic layer to cover a sidewall of the semiconductor single crystalline layer which is exposed by the common contact hole;

forming a second ohmic layer on at least a portion of the semiconductor substrate which is exposed by the common contact hole; and forming a common contact plug in the common contact hole.

2. The method of claim 1, further comprising, before the forming of the first ohmic layer, forming a blocking layer to expose the sidewall of the semiconductor single crystalline layer and cover the bottom of the common contact hole, wherein the blocking layer is removed after forming the first ohmic layer.

3. The method of claim 2, wherein the blocking layer is formed using physical vapor deposition (PVD) or sputtering.

4. The method of claim 3, wherein the blocking layer comprises titanium nitride.

* * * * *